United States Patent
Ou

(10) Patent No.: US 11,362,117 B2
(45) Date of Patent: Jun. 14, 2022

(54) MANUFACTURING METHOD OF ARRAY SUBSTRATE, ARRAY SUBSTRATE, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Tian Ou, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 270 days.

(21) Appl. No.: 16/644,988

(22) PCT Filed: Jan. 6, 2020

(86) PCT No.: PCT/CN2020/070418
§ 371 (c)(1),
(2) Date: Mar. 6, 2020

(87) PCT Pub. No.: WO2021/128454
PCT Pub. Date: Jul. 1, 2021

(65) Prior Publication Data
US 2021/0193696 A1    Jun. 24, 2021

(30) Foreign Application Priority Data

Dec. 23, 2019   (CN) .......................... 201911341006.4

(51) Int. Cl.
*H01L 27/12* (2006.01)
*H01L 29/49* (2006.01)
(Continued)

(52) U.S. Cl.
CPC ........ *H01L 27/1244* (2013.01); *G02F 1/1368* (2013.01); *G02F 1/133514* (2013.01);
(Continued)

(58) Field of Classification Search
CPC ............. H01L 27/1244; H01L 27/1288; H01L 29/4908; G02F 1/1368; G02F 1/13629; G02F 2201/50
(Continued)

(56) References Cited

U.S. PATENT DOCUMENTS 7,220,612 B2   5/2007  Ahn et al.
7,626,206 B2   12/2009 Ahn et al.
(Continued)

FOREIGN PATENT DOCUMENTS

CN   1651985 A  *  8/2005
CN   1651985 A     8/2005
(Continued)

OTHER PUBLICATIONS

Hu Yaozhi, et al.; Microfabrication Technology and Process of Mechanical and Electrical Products (机电产品微细加工技术与工艺; Feb. 28, 1993; Guangdong Science and Technology; China.

*Primary Examiner* — David Vu
*Assistant Examiner* — Brandon C Fox
(74) *Attorney, Agent, or Firm* — The Roy Gross Law Firm, LLC; Roy Gross

(57) ABSTRACT

The present application provides a method of manufacturing an array substrate, the array substrate, and a display device. In the method, a photoresist layer is removed by a plasma cleaning technique after performing etching to prevent a gate electrode of the array substrate from contacting a stripping solution, thereby preventing a metal layer of the gate electrode from being corroded by the stripping solution.

9 Claims, 3 Drawing Sheets

(51) Int. Cl.
*G02F 1/1335* (2006.01)
*G02F 1/1368* (2006.01)
*G02F 1/1362* (2006.01)

(52) U.S. Cl.
CPC ...... *H01L 27/1288* (2013.01); *H01L 29/4908* (2013.01); *G02F 1/13629* (2021.01); *G02F 2201/50* (2013.01)

(58) Field of Classification Search
USPC .......................................................... 257/72
See application file for complete search history.

(56) References Cited

U.S. PATENT DOCUMENTS

| | | | |
|---|---|---|---|
| 9,245,966 B2* | 1/2016 | Park | H01L 29/45 |
| 9,305,470 B2* | 4/2016 | Miki | H01L 23/53233 |
| 2002/0160547 A1* | 10/2002 | Shih | H01L 27/1288 |
| | | | 438/164 |
| 2006/0226484 A1 | 10/2006 | Tsai et al. | |
| 2006/0292726 A1* | 12/2006 | Akimoto | H01L 29/78678 |
| | | | 257/E21.414 |
| 2014/0014950 A1* | 1/2014 | Hara | G02F 1/136286 |
| | | | 257/43 |
| 2015/0303307 A1* | 10/2015 | Hara | H01L 27/1248 |
| | | | 257/43 |
| 2019/0109155 A1* | 4/2019 | Nishimiya | H01L 27/124 |

FOREIGN PATENT DOCUMENTS

| | | |
|---|---|---|
| CN | 1794077 A | 6/2006 |
| CN | 101192525 A | 6/2008 |
| CN | 101207027 A | 6/2008 |
| CN | 102651402 A | 8/2012 |
| CN | 103003860 A | 3/2013 |

* cited by examiner

MANUFACTURING METHOD OF ARRAY SUBSTRATE, ARRAY SUBSTRATE, AND DISPLAY DEVICE

FIELD OF INVENTION

The present application relates to the field of display technologies, and in particular, to a method of manufacturing an array substrate, the array substrate, and a display device.

BACKGROUND OF INVENTION

Liquid crystal displays (LCDs) have many advantages such as thinness, power saving, radiation-free, etc., and have been widely used. Generally, LCD panels include a color filter (CF) substrate, a thin film transistor (TFT) array substrate, and liquid crystals provided between the CF substrate and the TFT array substrate.

In a copper process of manufacturing TFT-LCD panels, when stripping a photoresist, a stripping solution will cause an edge of a metal layer of a gate electrode to be hollowed out and form cracks. This hollowing-out phenomenon may cause short circuiting between the gate electrode and metal of different layers, which seriously affects a yield of display device.

TECHNICAL PROBLEM

The present application provides a method of manufacturing an array substrate, the array substrate, and a display device. The method prevents a gate electrode from being corroded by a photoresist stripping solution, thereby preventing short circuiting between the gate electrode and metal of different layers. Therefore, display effect and yield are improved.

SUMMARY OF INVENTION

An embodiment of the present application provides a method of manufacturing an array substrate, an array substrate, and a display device. It prevents the gate electrode from being corroded when the photoresist is stripped and the formation of holes at edges of the gate electrode to cause short-circuit with metal of different layers, and thereby the yield of the display device is improved.

An embodiment of the present application provides a method of manufacturing an array substrate, and the method includes:

S10, sequentially forming a first metal layer, a second metal layer, and a protective layer stacked on a substrate;

S20, forming a photoresist layer on the protective layer and covering a part of an upper surface of the protective layer;

S30, removing the protective layer, the second metal layer, and the first metal layer that are not covered by the photoresist layer;

S40, removing the photoresist layer by a plasma cleaning technique to form a gate electrode; and S50, forming a gate insulating layer, an active layer, a source electrode, and a drain electrode on the gate electrode to form the array substrate.

In an embodiment of the present application, the step S30 further includes:

S301, removing the protective layer that is not covered by the photoresist layer by dry-etching; and S302, removing the second metal layer and the first metal layer that are not covered by the photoresist layer by wet-etching.

In an embodiment of the present application, the gas used in the plasma cleaning technique includes oxygen.

In an embodiment of the present application, a projection range of the second metal layer on the substrate is greater than and covers a projection range of the protective layer on the substrate, and a projection range of the first metal layer on the substrate is greater than and covers a projection range of the second metal layer on the substrate.

In an embodiment of the present application, material of the first metal layer includes molybdenum or titanium, and material of the second metal layer includes copper.

In an embodiment of the present application, the protective layer includes a film of silicon nitride.

According to the foregoing object of the present application, an array substrate is provided. The array substrate includes: a substrate; a gate electrode disposed on the substrate, and the gate electrode including a first metal layer, a second metal layer, and a protective layer which are stacked; a gate insulating layer covering the gate electrode; and an active layer, a source electrode, and a drain electrode disposed on the gate insulation layer, and the source electrode and the drain electrode electrically connected to two sides of the active layer, respectively.

In an embodiment of the present application, a projection range of the second metal layer on the substrate is greater than and covers a projection range of the protective layer on the substrate, and a projection range of the first metal layer on the substrate is greater than and covers a projection range of the second metal layer on the substrate.

In an embodiment of the present application, material of the first metal layer includes molybdenum or titanium, material of the second metal layer includes copper, and the protective layer includes a film of silicon nitride.

According to the above object of the present application, a display device is provided. The display device includes an array substrate and a color filter substrate disposed on a side of the array substrate, and the array substrate including: a substrate; a gate electrode disposed on the substrate, and the gate electrode including a first metal layer, a second metal layer, and a protective layer which are stacked; a gate insulating layer covering the gate electrode; and an active layer, a source electrode, and a drain electrode disposed on the gate insulation layer, and the source electrode and the drain electrode electrically connected to two sides of the active layer, respectively.

In an embodiment of the present application, a projection range of the second metal layer on the substrate is greater than and covers a projection range of the protective layer on the substrate, and a projection range of the first metal layer on the substrate is greater than and covers a projection range of the second metal layer on the substrate.

In an embodiment of the present application, material of the first metal layer includes molybdenum or titanium, material of the second metal layer includes copper, and the protective layer includes a film of silicon nitride.

Beneficial Effect

Compared to the prior art, the embodiments of the present application provide a manufacturing method of an array substrate, the array substrate, and a display device. A plasma cleaning technique is used to remove a photoresist layer to prevent edges of a metal layer of a gate electrode from being corroded by a stripping solution, which prevents short circuiting between the gate electrode and metal of different layers, thereby improving a product yield.

DESCRIPTION OF DRAWINGS

The following describes the specific implementation of the present application in detail with reference to the accompanying drawings to make the technical solution and other beneficial effects of the present application clear.

DETAILED DESCRIPTION OF PREFERRED EMBODIMENTS

Figure 1:
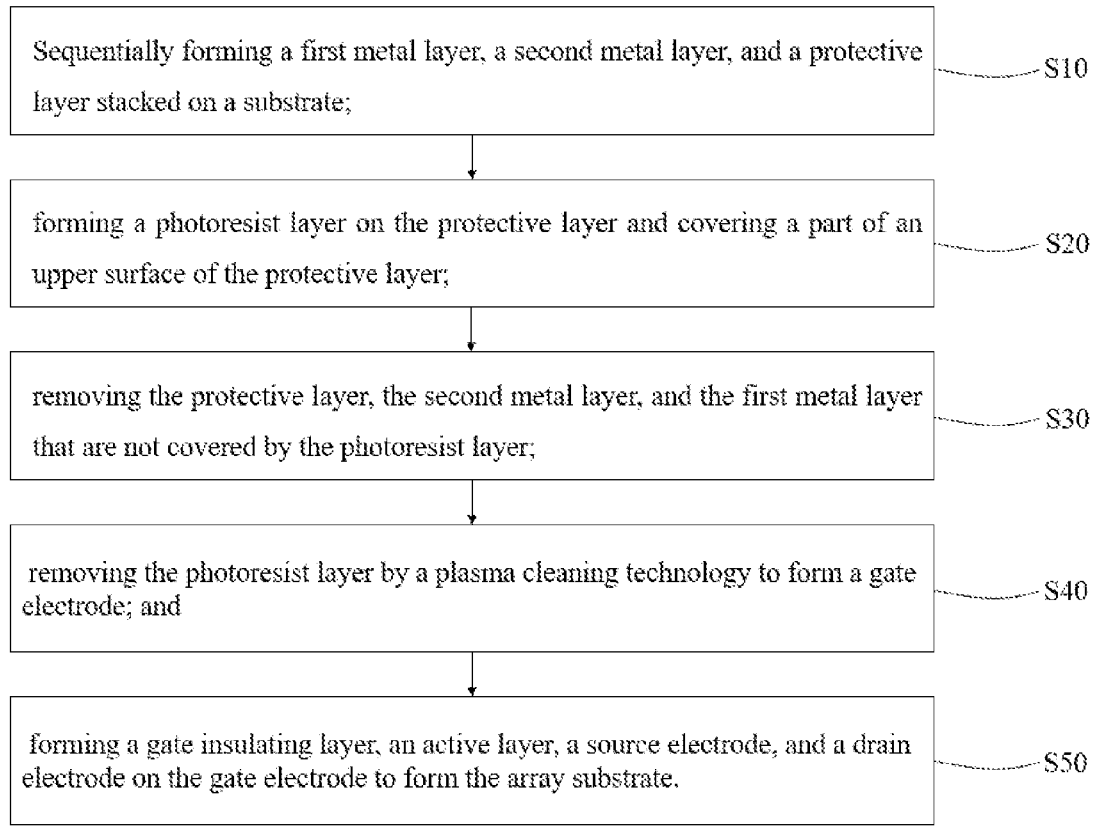
FIG. 1 is a flowchart of a method of manufacturing an array substrate according to an embodiment of the present application.

The technical solutions in the embodiments of the present application will be clearly and completely described below with reference to the accompanying drawings in the embodiments of the present application. Obviously, the described embodiments are only a part of the embodiments of the present application, but not all the embodiments. Based on the embodiments of the present application, all other embodiments obtained by those skilled in the art without creative effort fall into the protection scope of the present application.

In the description of the present application, it should be understood that the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", and the like are based on the orientation or position relationship shown in the drawings. It is only for the convenience of describing the present application and simplifying the description and does not indicate or imply that the device or element referred to must have a specific orientation, be constructed and operate in a specific orientation, and thereby cannot be understood as a limitation on the present application.

In addition, the terms "first" and "second" are used for descriptive purposes only and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless it is specifically defined otherwise.

In the description of the present application, it should be noted that, unless otherwise specified and limited, the terms "installation", "interconnection", and "connection" should be understood in a broad sense, for example, they can be a fixed connection, detachable connection, or integral connection; It can be a mechanical connection, electrical connection or can communicate with each other; It can be directly connected or indirectly connected by an intermediate medium. It can be the internal connection of two elements or the interaction between two elements. For those of ordinary skill in the art, the specific meanings of the above terms in the present application can be understood according to specific situations.

In the present application, unless explicitly stated and limited otherwise, the first feature "above" or "below" the second feature may include the first feature and the second feature in direct contact, it may also include the first feature and the second feature not in direct contact but in contact by another feature between them. Moreover, the first feature "above" and "on" the second feature may include that the first feature is directly above and obliquely above the second feature, or merely indicates that the horizontal height of the first feature is greater than that of the second feature. The first feature "below" and "under" the second feature may include that the first feature is directly below and obliquely below the second feature, or merely indicates that the horizontal height of the first feature is less than that of the second feature.

The following disclosure provides various implementations or embodiments for implementing various structures of the present application. To simplify the disclosure of the present application, the components and arrangements are described below with specific embodiments. Of course, they are merely embodiments and not intended to limit the present application. Furthermore, the present application may repeat reference numbers and/or reference letters in different embodiments, and such repetition is for the purpose of simplicity and clarity and does not indicate a relationship between the various embodiments and/or arrangements discussed. In addition, embodiments of various specific processes and materials are provided in the present application, however, those of ordinary skill in the art may recognize the application of other processes and/or the use of other materials.

The embodiments of the present application direct to a method of manufacturing an array substrate in the prior art. Since a metal layer of a gate electrode is prone to corrosion by a photoresist stripping solution which forms holes, this causes a technical problem of short circuiting between the gate electrode and metal of different layers. In view of the above technical problem, an embodiment of the present application provides a method of manufacturing an array substrate. Please refer to FIG. 1, the method includes:

S10, sequentially forming a first metal layer, a second metal layer, and a protective layer stacked on a substrate;

S20, forming a photoresist layer on the protective layer and covering a part of an upper surface of the protective layer;

S30, removing the protective layer, the second metal layer, and the first metal layer that are not covered by the photoresist layer;

S40, removing the photoresist layer by a plasma cleaning technique to form a gate electrode; and S50, forming a gate insulating layer, an active layer, a source electrode, and a drain electrode on the gate electrode to form the array substrate.

In the implementation process, when a gate electrode is manufactured, a micro-interface is formed between a first metal layer and a second metal layer after etching. When a stripping solution is used to remove the photoresist, the stripping solution will corrode the second metal layer at the micro-interface, resulting in a formation of holes at edges of the second metal layer. Sharp corners of the holes are prone to cause a short circuit with metal of different layers, which causes short circuiting between the gate electrode and metal of different layers and thereby affects a product yield. An embodiment of the present application provides a method of manufacturing an array substrate. By forming a protective layer on the metal layer and then using a plasma cleaning technique to remove the photoresist layer after an etching process is completed, it prevents the second metal layer of the gate electrode from contacting the stripping solution and forming holes at the second metal layer. Therefore, short circuiting between the gate electrode and metal of different layers is prevented, and the product yield is improved.

Further, please refer to FIG. 1 together with FIG. 2, FIG. 3, FIG. 4, FIG. 5, FIG. 6, and FIG. 7, the method of manufacturing the array substrate provided in the embodiment of the present application is described in detail.

Figure 2:
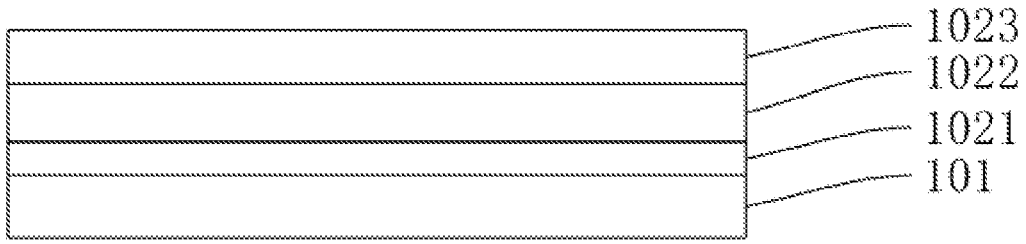
FIG. 2 is a schematic structural diagram of a manufacturing process of an array substrate according to an embodiment of the present application.

S10, please refer to FIG. 2, sequentially forming a first metal layer 1021, a second metal layer 1022, and a protective layer 1023 stacked on a substrate 101.

The substrate 101 can be a glass substrate, a material of the first metal layer 1021 can be molybdenum or titanium, a material of the second metal layer 1022 can be copper, and the protective layer 1023 can be a film of silicon nitride. A method of forming a film layer on the substrate 101 includes a physical sputtering method or a chemical vapor deposition method, which is not limited herein.

Figure 3:
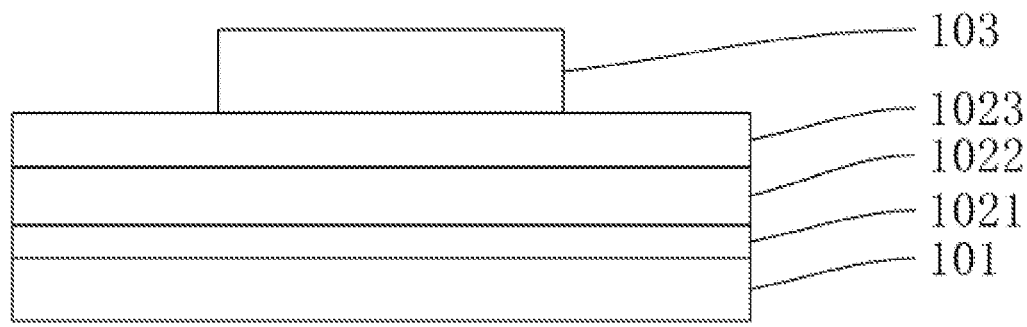
FIG. 3 is a schematic structural diagram of a manufacturing process of an array substrate according to an embodiment of the present application.

S20, please refer to FIG. 3, a photoresist layer 103 is prepared on the protective layer 1023 and covers a part of an upper surface of the protective layer 1023. The photoresist layer 103 is a patterned structure, and a film layer under the photoresist layer 103 will be etched into a predetermined pattern.

Figure 4:
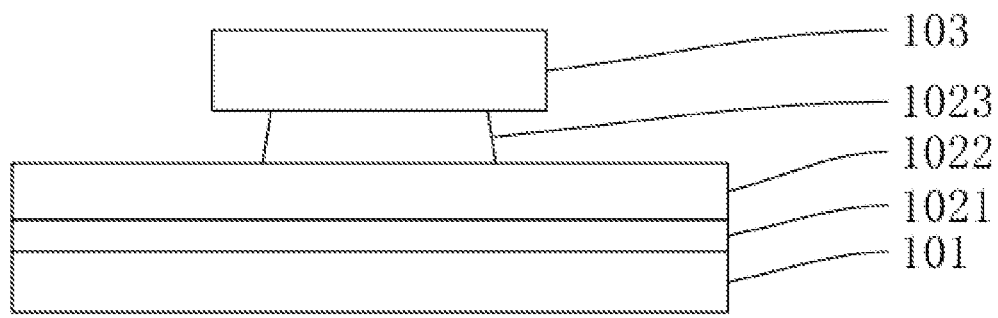
FIG. 4 is a schematic structural diagram of a manufacturing process of an array substrate according to an embodiment of the present application.
Figure 5:
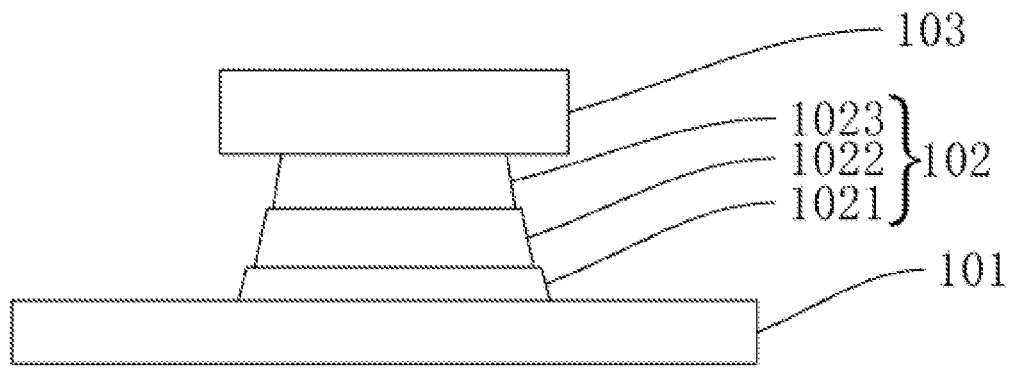
FIG. 5 is a schematic structural diagram of a manufacturing process of an array substrate according to an embodiment of the present application.

S30, please refer to FIG. 4 and FIG. 5, the protective layer 1023, the second metal layer 1022, and the first metal layer 1021 that are not covered by the photoresist layer 103 are removed.

The step S30 further includes:

S301, removing the protective layer 1023 that is not covered by the photoresist layer 103 by a dry-etching method; and S302, removing the second metal layer 1022 and the first metal layer 1021 that are not covered by the photoresist layer 103 by a wet-etching method.

Due to an effect of etching, the first metal layer 1021, the second metal layer 1022, and the protective layer 1023 form a trapezoidal structure, which gradually becomes smaller from bottom to top. That is, a projection range of the second metal layer 1022 on the substrate 101 is greater than and covers a projection range of the protective layer 1023 on the substrate 101, and a projection range of the first metal layer 1021 on the substrate 101 is greater than and covers a projection range of the second metal layer 1022 on the substrate 101.

Figure 6:
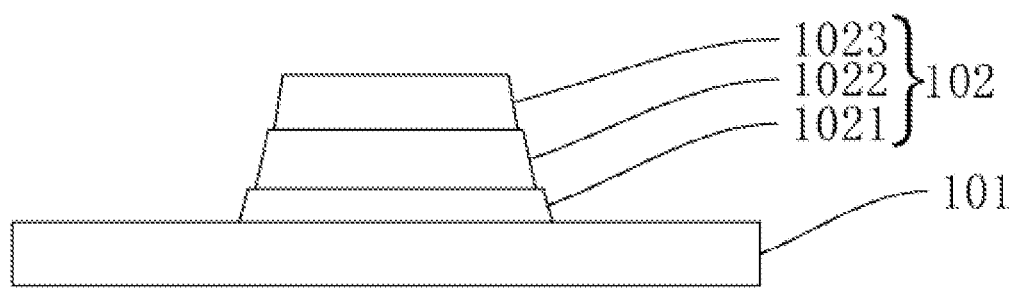
FIG. 6 is a schematic structural diagram of a manufacturing process of an array substrate according to an embodiment of the present application.

S40, please refer to FIG. 6, the photoresist layer 103 is removed by using a plasma cleaning technique to form a gate electrode 102.

A principle of the plasma cleaning technique is that when a radio frequency voltage is applied to a group of electrodes, a high-frequency alternating electric field is formed between the electrodes, and gas within the area forms plasma under an effect of the alternating electric field. The plasma performs dual actions of physical bombardment and chemical reaction on an object to be cleaned, so that the object becomes particles or gaseous substances which are discharged by vacuuming, thereby achieving a purpose of removing the object to be cleaned.

In an embodiment of the present application, the gas used in the plasma cleaning technique is oxygen, which achieves the purpose of removing the photoresist layer 103. In addition, during the manufacturing process, the second metal layer 1022 is prevented from contacting with the stripping solution, and holes are prevented from being formed at edges of the second metal layer 1022 to cause short circuiting between the gate electrode 102 and metal of different layers.

Figure 7:
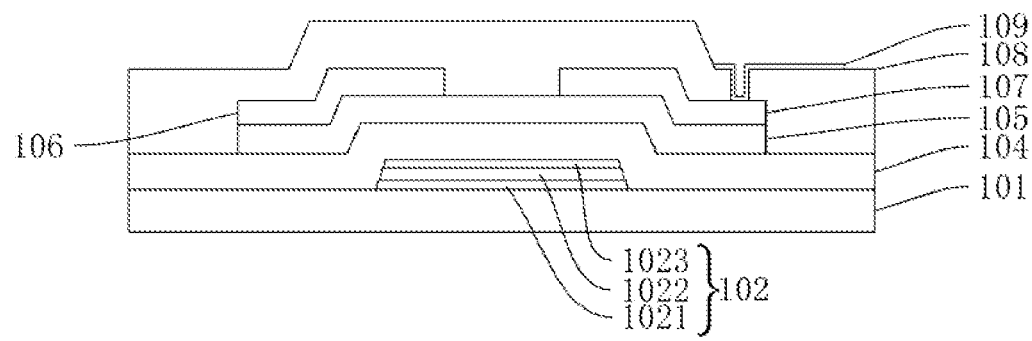
FIG. 7 is a schematic structural diagram of a manufacturing process of an array substrate provided by an embodiment of the present application.

S50, please refer to FIG. 7, a gate insulating layer 104, an active layer 105, a source electrode 106, and a drain electrode 107 are prepared on the gate electrode 102 to form the array substrate.

The step S50 further includes forming a passivation layer 108 and a pixel electrode 109 above the gate insulating layer 104, the active layer 105, the source electrode 106, and the drain electrode 107, wherein the pixel electrode 109 is electrically connected to the drain electrode 107 through a via-hole. In another embodiment of the present application, the pixel electrode 109 can also be electrically connected to the source electrode 106, and it can be selected according to the actual situation.

It should be noted that the active layer 105, the source electrode 106, and the drain electrode 107 can be prepared by conventional processes such as coating, exposure, development, etching, and stripping. The active layer 105 is made of a semiconductor material. A material of the source electrode 106 and the drain electrode 107 can be copper, and a material of the passivation layer 108 can be silicon nitride, which is the same as the material of the protective layer 1023. However, the source electrode 106 and the drain electrode 107 can also be manufactured according to the method described in the embodiment of the present application, i.e. manufactured with a layered structure of molybdenum and copper. A protective layer is first prepared on the metal layer and then a stripping process is performed by using a plasma cleaning technique to strip the photoresist, which can effectively prevent the phenomenon of holes formed at the source electrode 106 and the drain electrode 107. As mentioned, other metal trace on the array substrate can be prepared according to the above method, which can further improve the product yield.

In addition, a purpose of setting the protective layer 1023 in the embodiment of the present application is to protect the second metal layer 1022. First, it can prevent the second metal layer 1022 from oxidizing with oxygen during the plasma cleaning process, which greatly increases the resistance of the second metal layer 1022 and may affect normal use of products. In addition, it can prevent a chemical reaction between oxygen and the photoresist layer 103 and the second metal layer 1022, which generates other compounds and results in contamination of the second metal layer 1022, which may affect the display effect.

As described above, in a manufacturing method of an array substrate provided in an embodiment of the present application, a protective layer is first prepared to cover the second metal layer, and then a photoresist layer is prepared to perform etching. During removal of the photoresist layer, a plasma cleaning technique is used to prevent the second metal layer from contacting the stripping solution so that the second metal layer is prevented from being corroded by the stripping solution and forming holes. Therefore, short circuiting between the gate electrode and metal of different layers is prevented, and the product yield is improved.

In addition, an embodiment of the present application further provides an array substrate, and the array substrate can be manufactured by the method of manufacturing the array substrate described above.

Please refer to FIG. 7, the array substrate includes a substrate 101, a gate electrode 102 disposed on the substrate 101, a gate insulating layer 104 covering the gate electrode 102, an active layer 105 disposed on the gate insulating layer 104 and above the gate electrode 102, a source electrode 106 and a drain electrode 107 disposed on two sides of the active layer 105 and connected with the two sides of the active layer 105, a passivation layer 108 covering the active layer 105, the source electrode 106, and the drain electrode 107, and a pixel electrode 109 disposed on the passivation layer 108 and electrically connected to the drain electrode 107 through a via-hole.

The substrate 101 can be a glass substrate, the gate electrode 102 includes a stacked first metal layer 1021, a second metal layer 1022, and a protective layer 1023, wherein the material of the first metal layer 1021 includes molybdenum or titanium, the material of the second metal layer 1022 includes copper, and the protective layer 1023 includes a film of silicon nitride. In addition, the projection range of the second metal layer 1022 on the substrate 101 is greater than and covers the projection range of the protective layer 103 on the substrate 101, and the projection range of the first metal layer 1021 on the substrate 101 is greater than and covers the projection range of the second metal layer 1022 on the substrate 101.

The active layer 105, the source electrode 106, and the drain electrode 107 can be prepared by conventional processes such as coating, exposure, development, etching, and stripping. The active layer 105 is made of semiconductor material. The material of the source electrode 106 and the drain electrode 107 can be copper, and the material of the passivation layer 108 can be silicon nitride, which is the same as the material of the protective layer 1023. However, the source electrode 106 and the drain electrode 107 can also be manufactured according to the method described in the embodiment of the present application, i.e. manufactured with a layered structure of molybdenum and copper. A protective layer is first prepared on the metal layer and then a stripping process is performed by using a plasma cleaning technique to strip the photoresist, which can effectively prevent the phenomenon of holes formed at the source electrode 106 and the drain electrode 107. As mentioned, other metal trace on the array substrate can be prepared according to the above method, which can further improve the product yield.

In addition, a structure of the array substrate can be a bottom gate type, a top gate type, or other structures. The embodiment of the present application is illustrated by the structure shown in the drawings but is not limited thereto. In the embodiment of the present application, a display device is further provided. The display device includes the array substrate as described above, the structure and the manufacturing method of the array substrate are the same as those in the above embodiments and are not repeated herein, and the display device further includes a color filter substrate disposed on one side of the array substrate.

It should be noted that only the array substrate and the color filter substrate of the display device are mentioned. These structural layers only briefly describe some structures and components of the display device but are not limited thereto. For example, the color filter substrate includes a black matrix (BM), an RGB color resist layer, and the like. The array substrate further includes a thin film transistor (TFT) switch, a scan line, a data line, a common electrode, etc. The display device also includes various other display components, such as an alignment film, a liquid crystal layer, a frame adhesive, and the like between the array substrate and the color filter substrate. These details can be implemented with reference to the prior art, and are not repeated herein.

As described above, the embodiments of the present application provide a method of manufacturing an array substrate, the array substrate, and a display device. A protective layer is formed to cover a second metal layer, and then a photoresist layer is formed to perform etching. When removing the photoresist layer, a plasma cleaning technique is used to prevent the second metal layer from contacting a stripping solution so that the second metal layer is prevented from being corroded by the stripping solution and forming holes. Therefore, short circuiting between a gate electrode and metal of different layers is prevented, and product yield is improved. In addition, the source electrode 106 and the drain electrode 107 in the array substrate can also be manufactured according to the method described in the embodiment of the present application, and can be manufactured with a layered structure of molybdenum and copper. As mentioned, a protective layer is first prepared on the metal layer. The plasma cleaning technique is used when stripping the photoresist layer, which can effectively prevent the phenomenon of holes formed at the source electrode 106 and the drain electrode 107. Similarly, other metal trace on the array substrate can be prepared according to the above method, which can further improve the product yield. The display device in the embodiment of the present application uses the above-mentioned array substrate, which improves a display effect of the display device and improves the yield of the display device.

In the above embodiments, the description of each embodiment has its own emphasis. For a part that is not described in detail in an embodiment, reference may be made to related descriptions in other embodiments.

The manufacturing method of the array substrate, the array substrate, and the display device provided in the embodiments of the present application have been described in detail above. Specific embodiments are used herein to explain the principle and implementation of the present application. The descriptions of the above embodiments are only used to help understand the technical solution of the present application and its core ideas. Those of ordinary skill in the art should understand that the technical solutions described in the embodiments can be modified, or some of the technical features can be equivalently replaced. These modifications or replacements do not make the essence of the corresponding technical solutions outside the scope of the technical solutions of the embodiments of the present application.

What is claimed is:

1. A method of manufacturing an array substrate, comprising following steps:
    S10, sequentially forming a first metal layer, a second metal layer, and a protective layer stacked on a substrate, wherein the protective layer comprises a film of silicon nitride;
    S20, forming a photoresist layer on the protective layer and covering a part of an upper surface of the protective layer;

S30, removing the protective layer, the second metal layer, and the first metal layer that are not covered by the photoresist layer;

S40, removing the photoresist layer by a plasma cleaning technique to form a gate electrode; and S50, forming a gate insulating layer, an active layer, a source electrode, and a drain electrode on the gate electrode to form the array substrate.

2. The method of manufacturing the array substrate of claim 1, wherein the step S30 further comprises:

S301, removing the protective layer that is not covered by the photoresist layer by dry-etching; and S302, removing the second metal layer and the first metal layer that are not covered by the photoresist layer by wet-etching.

3. The method of manufacturing the array substrate of claim 1, wherein a gas used in the plasma cleaning technique comprises oxygen.

4. The method of manufacturing the array substrate of claim 1, wherein a projection range of the second metal layer on the substrate is greater than and covers a projection range of the protective layer on the substrate, and a projection range of the first metal layer on the substrate is greater than and covers a projection range of the second metal layer on the substrate.

5. The method of manufacturing the array substrate of claim 1, wherein a material of the first metal layer comprises molybdenum or titanium, and a material of the second metal layer comprises copper.

6. An array substrate, comprising:

a substrate;

a gate electrode disposed on the substrate, wherein the gate electrode comprises a first metal layer, a second metal layer, and a protective layer which are stacked, and wherein a material of the first metal layer comprises molybdenum or titanium, a material of the second metal layer comprises copper, and the protective layer comprises a film of silicon nitride;

a gate insulating layer covering the gate electrode; and an active layer, a source electrode, and a drain electrode disposed on the gate insulation layer, wherein the source electrode and the drain electrode are electrically connected to two sides of the active layer, respectively.

7. The array substrate of claim 6, wherein a projection range of the second metal layer on the substrate is greater than and covers a projection range of the protective layer on the substrate, and a projection range of the first metal layer on the substrate is greater than and covers a projection range of the second metal layer on the substrate.

8. A display device, comprising an array substrate and a color filter substrate disposed on a side of the array substrate, and the array substrate comprising:

a substrate;

a gate electrode disposed on the substrate, wherein the gate electrode comprises a first metal layer, a second metal layer, and a protective layer which are stacked, and wherein a material of the first metal layer comprises molybdenum or titanium, a material of the second metal layer comprises copper, and the protective layer comprises a film of silicon nitride;

a gate insulating layer covering the gate electrode; and an active layer, a source electrode, and a drain electrode disposed on the gate insulation layer, wherein the source electrode and the drain electrode are electrically connected to two sides of the active layer, respectively.

9. The display device of claim 8, wherein a projection range of the second metal layer on the substrate is greater than and covers a projection range of the protective layer on the substrate, and a projection range of the first metal layer on the substrate is greater than and covers a projection range of the second metal layer on the substrate.

* * * * *